US009952289B2

United States Patent
Hanyu et al.

(10) Patent No.: US 9,952,289 B2
(45) Date of Patent: Apr. 24, 2018

(54) STORAGE BATTERY EVALUATING APPARATUS AND METHOD (71) Applicant: KABUSHIKI KAISHA TOSHIBA, Tokyo (JP)

(72) Inventors: Yuki Hanyu, Kanagawa (JP); Takahiro Yamamoto, Tokyo (JP); Toru Ezawa, Kanagawa (JP); Akihiro Itakura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 117 days.

(21) Appl. No.: 14/921,388

(22) Filed: Oct. 23, 2015

(65) Prior Publication Data
US 2016/0116547 A1 Apr. 28, 2016

(30) Foreign Application Priority Data

Oct. 28, 2014 (JP) .................................. 2014-219393

(51) Int. Cl.
*G01R 31/36* (2006.01)
*H02J 7/00* (2006.01)
*G01R 35/00* (2006.01)

(52) U.S. Cl.
CPC ..... *G01R 31/3679* (2013.01); *G01R 31/3648* (2013.01); *G01R 31/3651* (2013.01); *G01R 35/00* (2013.01); *H02J 7/007* (2013.01)

(58) Field of Classification Search
CPC ............ G01R 31/3679; G01R 31/3648; G01R 31/3651; H02J 7/007

(Continued)

(56) References Cited

U.S. PATENT DOCUMENTS 6,789,026 B2    9/2004 Barsoukov et al.
7,091,698 B2 *  8/2006 Yamazaki .......... G01R 31/3679
                                                   320/132

(Continued)

FOREIGN PATENT DOCUMENTS

EP    1 505 401      2/2005
JP    2010-60384     3/2010

(Continued)

OTHER PUBLICATIONS

Communication from the European Patent Office dated Mar. 24, 2016, for European Patent Application No. 15 19 1501.4-1568.

(Continued)

*Primary Examiner* — M'Baye Diao
(74) *Attorney, Agent, or Firm* — Finnegan, Henderson, Farabow, Garrett & Dunner, L.L.P.

(57) ABSTRACT

A storage battery evaluating apparatus according to an embodiment includes a determiner, a corrector, a QV curve generator, an evaluator, and a feedbacker. The determiner determines a charging/discharging tendency of a storage battery based on measurement data including voltage data. The corrector corrects the voltage data based on a correction parameter. The correction parameter corresponds to at least one of the charging/discharging tendency and a degraded state of the storage battery. The QV curve generator generates a QV curve of the storage battery based on the voltage data which has been corrected. The evaluator evaluates the degraded state based on the QV curve. The feedbacker feeds back, to the corrector, the corrected parameter corresponding to the degraded state.

10 Claims, 11 Drawing Sheets (58) Field of Classification Search
USPC .............................. 320/134; 324/432; 702/63
See application file for complete search history.

(56) References Cited

U.S. PATENT DOCUMENTS

| | | | |
|---|---|---|---|
| 8,099,180 B2* | 1/2012 | Schoch | G01R 31/3651 |
| | | | 320/132 |
| 8,615,372 B2 | 12/2013 | Tomura et al. | |
| 9,297,859 B2* | 3/2016 | Mukaitani | G01R 31/3624 |
| 2009/0051321 A1 | 2/2009 | Sato | |
| 2012/0169288 A1 | 7/2012 | Ueki et al. | |
| 2012/0323512 A1 | 12/2012 | Rhodin | |
| 2013/0314050 A1 | 11/2013 | Matsubara et al. | |
| 2013/0314095 A1* | 11/2013 | Nakashima | G01R 31/3679 |
| | | | 324/433 |
| 2013/0335009 A1 | 12/2013 | Katsumata et al. | |
| 2015/0046109 A1 | 2/2015 | Miwa et al. | |
| 2015/0160304 A1* | 6/2015 | Nam | G01R 31/3679 |
| | | | 702/63 |

FOREIGN PATENT DOCUMENTS

| | | |
|---|---|---|
| JP | 2013-81332 | 5/2013 |
| JP | 2013-225441 | 10/2013 |
| JP | 2013-247003 | 12/2013 |
| JP | 2014-2055 | 1/2014 |
| JP | 2014-92471 | 5/2014 |
| JP | 2015-60761 | 3/2015 |
| WO | WO 2014/083813 | 6/2014 |
| WO | WO 2014/122721 | 8/2014 |
| WO | WO 2014/156265 | 10/2014 |
| WO | WO 2015/041091 A1 | 3/2015 |

OTHER PUBLICATIONS

Tomohiko Ikeya, et al., "A proposal of battery degradation analysis method with EV real driving data", Central Research Institute of Electric Power Industry, Kanagawa, Japan, 2805, p. 100, (2013).

* cited by examiner

FIG. 1

| NAME OF CHARACTERISTIC QUANTITY | CALCULATING METHOD | SoC RANGE |
|---|---|---|
| $V_{LMO}$ | MAXIMUM POINT OVER 4 V | 70~90 |
| $V_{MAX/5}$ | POINT EXCEEDING THRESHOLD VALUE | 0~20 |
| $Q_{LMO}$ | AREA TO THE RIGHT OF $V_{LMO}$ | 70~100 |
| $Q_{NCA}$ | AREA TO THE LEFT OF $V_{LMO}$ | 0~90 |
| $Q_{LMO}/Q$ | $Q_{LMO}/Q$ | 70~90 |
| $Q_{NCA}/Q$ | $Q_{NCA}/Q$ | 0~90 |
| $Q_{NCA}/Q_{LMO}$ | $Q_{NCA}/Q_{LMO}$ | 0~90 |
| $V_{LMO}-V_{MAX/5}$ | $V_{LMO}-V_{MAX/5}$ | 0~90 |

SoC RANGE DB

| FOR EV | SoC | CURRENT | TEMPERATURE | DEGRADED TIME WITH CURRENT | DEGRADED TIME WITHOUT CURRENT | CAPACITY | INTERNAL RESISTANCE |
|---|---|---|---|---|---|---|---|
| 30 Ah CELL | 70 | 1C | 45°C | 13318 Min | 6842 Min | 26.728 Ah | 0.000892 |

| NAME OF CHARACTERISTIC QUANTITY | VALUE | CALCULATING METHOD | SoC RANGE |
|---|---|---|---|
| $V_{LMO}$ | 4.1305 | MAXIMUM POINT OVER 4 V | 70~90 |
| $V_{MAX/5}$ | 3.8161 | POINT EXCESSING THRESHOLD VALUE | 0~20 |
| $Q_{LMO}$ | 11795 | AREA TO THE RIGHT OF $V_{LMO}$ | 70~100 |
| $Q_{NCA}$ | 13859 | AREA TO THE LEFT OF $V_{LMO}$ | 0~90 |
| $Q_{LMO}/Q$ | 0.4597724 | $Q_{LMO}/Q$ | 70~90 |
| $Q_{NCA}/Q$ | 0.5402276 | $Q_{NCA}/Q$ | 0~90 |
| $Q_{NCA}/Q_{LMO}$ | 1.1749694 | $Q_{NCA}/Q_{LMO}$ | 0~90 |
| $V_{LMO}-V_{MAX/5}$ | 0.3144 | $V_{LMO}-V_{MAX/5}$ | 0~90 |

FIG. 8

|  |  | CHARGING TENDENCY | | DISCHARGING TENDENCY | |
|---|---|---|---|---|---|
|  |  | A | B | A | B |
| 10s | CHARGE | 0.001125 | 0.05625 | 0.001125 | −0.00275 |
|  | DISCHARGE | 0.001042 | 0.01575 | 0.001125 | −0.03875 |
| 20s | CHARGE | 0.000792 | 0.0545 | 0.000813 | −0.00075 |
|  | DISCHARGE | 0.000792 | 0.0205 | 0.000792 | −0.0315 |
| 50s | CHARGE | 0.000467 | 0.044 | 0.000425 | −0.00275 |
|  | DISCHARGE | 0.000417 | 0.0295 | 0.000417 | −0.0105 |
| 100s | CHARGE | 0.000254 | 0.03275 | 0.000229 | −0.00475 |
|  | DISCHARGE | 0.000242 | 0.0385 | 0.000229 | 0.00425 |

STORAGE BATTERY EVALUATING APPARATUS AND METHOD

CROSS REFERENCE TO RELATED APPLICATION(S)

This application is based upon and claims the benefit of priority from the prior Japanese Patent Application No. 2014-219393, filed on Oct. 28, 2014, the entire contents of which are incorporated herein by reference.

FIELD

Embodiments described herein relate generally to a storage battery evaluating apparatus and method.

BACKGROUND

To evaluate a degraded state of a storage battery, charging/discharging a storage battery with a constant current between a full discharged state and a full charged state to obtain a QV curve has been known. Since the degraded state of the storage battery is correlated with the QV curve, the degraded state of the storage battery can be evaluated by analyzing the QV curve.

When the storage battery is evaluated by this evaluating method in an electric power storage system (ESS) in which a load fluctuates constantly, the charging/discharging of the power storage system needs to be stopped temporarily. In addition, the electric power having been charged in the storage battery needs to be dumped or stored temporarily in another storage battery.

DETAILED DESCRIPTION

Embodiments will now be explained with reference to the accompanying drawings. The present invention is not limited to the embodiments.

A storage battery evaluating apparatus according to an embodiment includes a determiner, a corrector, a QV curve generator, an evaluator, and a feedbacker. The determiner determines a charging/discharging tendency of a storage battery based on measurement data including voltage data of the storage battery. The corrector corrects the voltage data based on a correction parameter. The correction parameter corresponds to at least one of the charging/discharging tendency and a degraded state of the storage battery. The QV curve generator generates a QV curve of the storage battery based on the corrected voltage data. The evaluator evaluates the degraded state according to the QV curve. The feedbacker feeds back, to the corrector, the corrected parameter corresponding to the degraded state.

Figure 1:
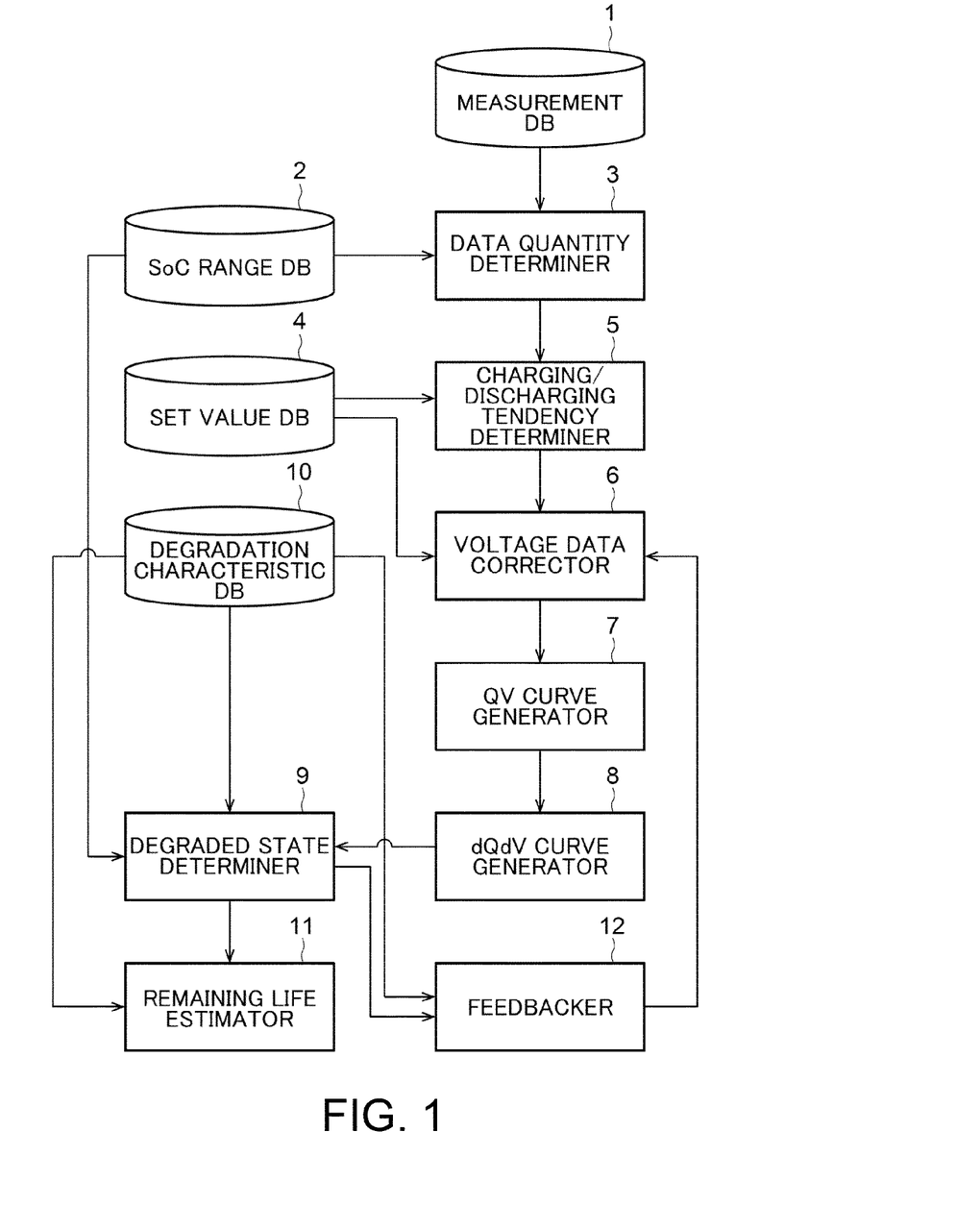
FIG. 1 is a block diagram illustrating a functional structure of a storage battery evaluating apparatus according to an embodiment.

A functional structure of the storage battery evaluating apparatus (hereinafter referred to as the "evaluating apparatus") according to the embodiment will be described first by referring to FIGS. 1 to 9. FIG. 1 illustrates blocks of the functional structure of the evaluating apparatus. As illustrated in FIG. 1, the evaluating apparatus includes a measurement database (DB) 1, a state of charge (SoC) range DB 2, a data quantity determiner 3, a set value DB 4, a charging/discharging tendency determiner 5, a voltage data corrector 6, a QV curve generator 7, a dQdV curve generator 8, a degradation characteristic DB 10, a degraded state evaluator 9, a remaining life estimator 11, and a feedbacker 12.

The measurement DB 1 stores measurement data of the storage battery to be evaluated for its degraded state. The storage battery to be evaluated may be, but not limited to, a lithium secondary battery, for example. The measurement data includes voltage data of the storage battery. The measurement data may include data, such as current data, the SoC data, and data of the charged amount, power, and temperatures of the storage battery.

The measurement data DB1 may, for example, store obtained measurement data output from a power storage system including the storage battery. For example, the power storage system may be implemented by, but not limited to, a portable electronic device, an electric vehicle, or a large power storage system, for example. The measurement data may preferably be obtained in the measurement DB 1 at shortest possible intervals within a range satisfying such restrictions as a processing capacity, a data storage quantity, etc. of the evaluating apparatus.

The measurement DB 1 may directly obtain the measurement data from the power storage system, or from an external server or the like that stores the measurement data.

The SoC range DB 2 stores a type, a calculation method and an SoC range of the characteristic quantity used in evaluating the storage battery.

The characteristic quantity is a parameter correlated with the degraded state of the storage battery, and calculated from the QV curve or the dQdV curve. The evaluating apparatus evaluates the degraded state of the storage battery based on the characteristic quantity. The QV and dQdV curves and the characteristic quantity will be described later.

The SoC range is a range of the SoC of the storage battery where a particular characteristic quantity appears. The characteristic quantity appears in different SoC ranges according to the type of the characteristic quantity. To calculate the characteristic quantity, the measurement data of the SoC range for each characteristic quantity is needed. The SoC range DB 2, therefore, stores the SoC range for each characteristic quantity.

Figure 2:
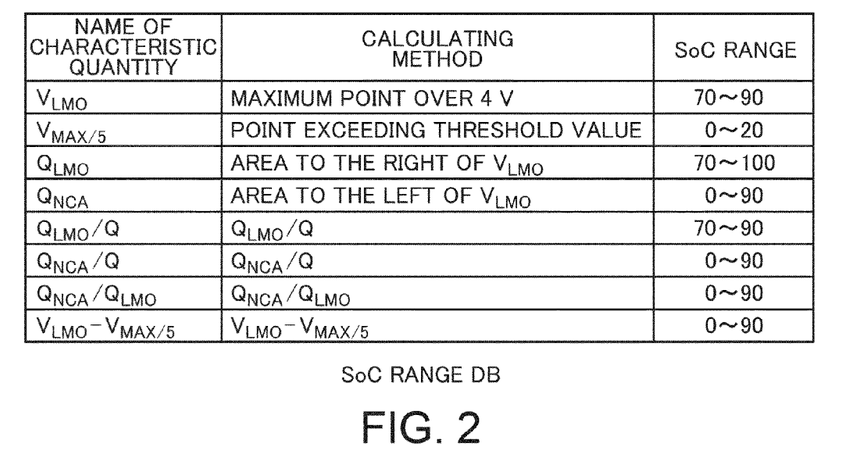
FIG. 2 illustrates an example of a state of charge (SoC) range database.

FIG. 2 illustrates an example of the SoC range DB 2. The SoC range DB 2 of FIG. 2 illustrates the characteristic quantity calculated from a dQdV curve of a lithium secondary battery having a negative pole and a positive pole. The negative pole includes graphite and the positive pole includes manganic acid and a nickel-aluminum oxide. In the SoC range DB 2 of FIG. 2, the name, the calculating method, and the SoC range are stored for each type of the characteristic quantity. For example, according to FIG. 2, it is found that a characteristic quantity $V_{LMO}$ represents the maximum point over 4 V on the dQdV curve and appears when the SoC is 70% to 90%.

The calculating method and the SoC range are thus stored in the SoC DB 2 for each characteristic quantity, as illustrated in FIG. 2. The SoC range DB 2 may store one or more types of the characteristic quantities. The SoC range DB 2 can be generated based on a degradation characteristic DB 10 which will be described later.

The data quantity determiner 3 determines whether the data quantity of the measurement data stored in the measurement DB 1 is sufficient for evaluating the degraded state of the storage battery. The data quantity determiner 3 determines a data quantity for each SoC range of the characteristic quantity used for evaluation. For example, when the characteristic quantity $V_{LMO}$ is used to perform the evaluation, the data quantity determiner 3 determines whether there is a sufficient quantity of measurement data in the SoC range of 70% to 90%.

The data quantity determiner 3 determines whether the data quantity is sufficient by comparing, for example, with a predetermined threshold value, an absolute data quantity of the measurement data included in the corresponding SoC range, or a covering rate of the SoC corresponding to such measurement data relative to the SoC range.

When the SoC is included in the measurement data, the data quantity determiner 3 can determine the data quantity using this SoC. When the SoC is not included in the measurement data, the data quantity determiner 3 may calculate the SoC corresponding to the measurement data from the voltage or current data included in the measurement data to determine the data quantity.

The set value DB 4 stores initial set values and set values i, j of the correction parameter. The correction parameter is used for correcting the voltage data of the storage battery. The correction parameter is correlated with the degraded state of the storage battery. The voltage data corrector 6, which will be described later, corrects the voltage data using the correction parameter corresponding to the degraded state of the storage battery or the initial set value of the correction parameter. The correction parameter may include, for example, an ohmic resistance $R_{CT}$ and a relaxation parameter. The correction parameter and the set values i, j will be described in detail later.

The charging/discharging tendency determiner 5 (hereinafter referred to as the "tendency determiner 5") determines a charging/discharging tendency of the storage battery according to the measurement data. The storage battery repeats charging and discharging during operation of the power storage system, and the tendency of charging/discharging may temporarily be biased to the charging side or the discharging side. Such a biased tendency of the charging/discharging is referred to as a charging/discharging tendency. A state where the charging/discharging tendency is biased on the charging side is referred to as a charging tendency, and a state where the charging/discharging tendency is biased on the discharging side is referred to as a discharging tendency.

Figure 3:
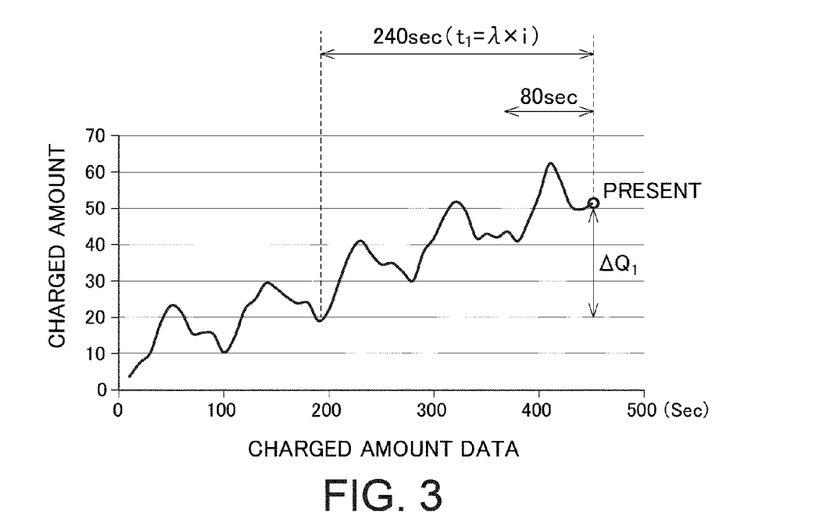
FIG. 3 illustrates an example of charged amount data.

The tendency determiner 5 determines the charging/discharging tendency according to a variation $Q_1$ of the charged amount of the storage battery during a predetermined period $t_1$ up to a time point (present time) at which the tendency determiner is determined. FIG. 3 illustrates an example of the charged amount data. In FIG. 3, the vertical axis represents the charged amount and the horizontal axis represents time.

The tendency determiner 5 first calculates a charging/discharging cycle λ of the storage battery from the charged amount data. The cycle λ can be calculated by, for example, applying regression analysis or Fourier transform using sine curves to the charged amount data. In FIG. 3, the cycle λ is 80 seconds. Unlike the example of FIG. 3, if no charged amount data is included in the measurement data, the tendency determiner 5 may generate the charged amount data from the current or voltage data to calculate the cycle λ. The tendency determiner 5 may also calculate the cycle λ by calculating a frequency with which the sign of the differential value of the current data is changed.

The tendency determiner 5 then calculates time equivalent to i cycles during the time period $t_1$. That is, $t_1 = \lambda \times i$, where i is a set value for calculating the period $t_1$ and stored in the set value DB 4. For example, when i=3, the period $t_1$ is 240 seconds.

The tendency determiner 5 calculates a variation $\Delta Q_1$ of the charged amount of the storage battery during the period $t_1$. When the charged amount data is included in the measurement data as illustrated in FIG. 3, the tendency determiner 5 can calculate the variation $\Delta Q_1$ by subtracting, from the present charged amount, a former charged amount at time preceding the present time by $t_1$. When the charged amount data is not included in the measurement data, the tendency determiner 5 may generate the charged amount data from the current or voltage data to calculate the variation $\Delta Q_1$. The tendency determiner 5 may also calculate the variation $\Delta Q_1$ by determining an accumulated value of the current data between the present time and the time preceding the present time by $t_1$. Further, the tendency determiner 5 may calculate, instead of the variation $\Delta Q_1$, a variation $\Delta SoC$ which is a variation of the SoC of the storage battery.

The tendency determiner 5 determines the charging/discharging tendency based on the sign of the variation $\Delta Q_1$. When the sign of the variation $\Delta Q_1$ is positive ($\Delta Q_1 > 0$), the tendency determiner 5 determines the charging tendency. When the sign of the variation $\Delta Q_1$ is negative ($\Delta Q_1 < 0$), the tendency determiner 5 determines the discharging tendency. This also applies to the variation $\Delta SoC$.

The period $t_1$ or the cycle λ may be determined in advance. In this case, the period $t_1$ and the cycle λ are stored in the set value DB 4.

The method of determining the charging/discharging tendency is not limited to the above method. For example, the tendency determiner 5 may determine the charging/discharging tendency by applying a Kalman filter to the charged amount data, or using a slope of a moving average line of the charged amount data. With the slope of the moving average line, the tendency determiner 5 determines the charging tendency when the sign of the slope is positive, while determining the discharging tendency when the sign of the slope is negative. In any determination method, various parameters (e.g., a period to calculate the moving average, weight, a smoothing coefficient, etc.) used for the determination are stored in the set value DB 4.

The voltage data corrector 6 (hereinafter referred to as the "corrector 6") corrects the voltage data of the storage battery. The voltage data of the storage battery that repeats charging and discharging includes a voltage component caused by an internal resistance of the storage battery. The corrector 6 corrects the voltage data by removing, from the voltage data, such a voltage component caused by the internal resistance.

A voltage V of the voltage data can be represented as $V=V^0+V_{CT}+V_d$. The voltage $V^0$ is an open circuit voltage (OCV) which is a voltage of the storage battery when an infinitely small current is used for charging/discharging. The voltage $V^0$ represents a voltage intrinsic to the storage battery obtained by removing the effect of the internal resistance.

Figure 4:
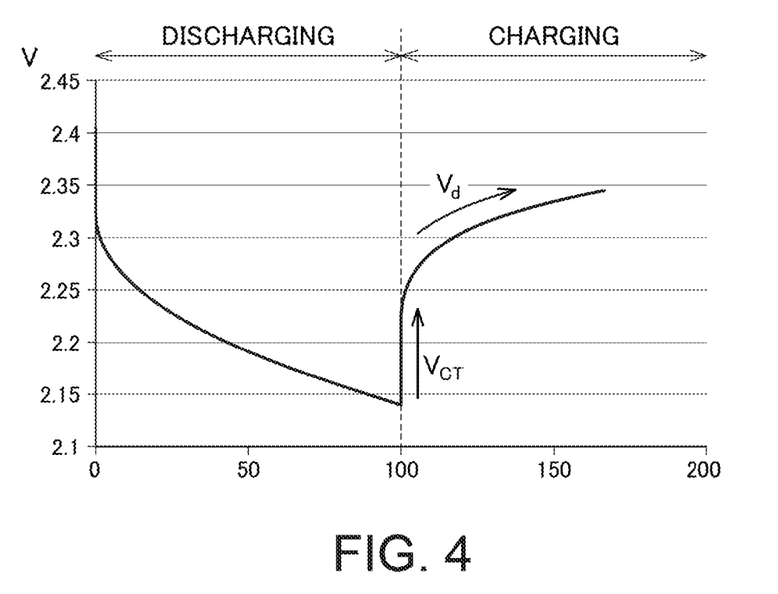
FIG. 4 is an explanatory view of a voltage response of the storage battery.

The voltage $V_{CT}$ represents a voltage component ($V_{CT}=I \times R_{CT}$) caused by the ohmic resistance $R_{CT}$. The ohmic resistance $R_{CT}$ refers to a resistance component with no time constant included. The ohmic resistance $R_{CT}$ may be handled substantially as a constant, although the time constant equal to or smaller than a few seconds may sometimes be included. Thus, as illustrated in FIG. 4, the voltage $V_{CT}$ is generated by immediately responding to the change of the current I when the charging and discharging are switched. The ohmic resistance $R_{CT}$ is correlated with the degraded state of the storage battery.

The voltage $V_d$ is a voltage component ($V_d=I \times R_d$) caused by a non-ohmic resistance $R_d$. The non-ohmic resistance $R_d$ represents a resistance component of the internal resistance of the storage battery, with the time constant included therein. The non-ohmic resistance $R_d$ includes the time constant of about a few seconds to a few hours. Accordingly, when the charging and discharging of the storage battery are switched, as illustrated in FIG. 4, the voltage $V_d$ does not immediately respond to such a change of the current I and exhibits a behavior called relaxation. The non-ohmic resistance $R_d$ is correlated with the degraded state or the charging/discharging tendency of the storage battery.

The corrector 6 calculates the voltage component caused by the internal resistance based on the correction parameter that corresponds to at least one of the charging/discharging tendency and the degraded state of the storage battery, to thereby correct the voltage data.

The corrector 6 may, for example, calculate the voltage $V_{CT}$ by $V_{CT}=I \times R_{CT}$ using the ohmic resistance $R_{CT}$ corresponding to the degraded state of the storage battery. The corrector 6 can correct the voltage data by subtracting the voltage $V_{CT}$ from the voltage V of the voltage data. The ohmic resistance $R_{CT}$ used as the correction parameter is stored in advance, with the degraded state associated therewith, in the degradation characteristic DB 10 which will be described later.

The corrector 6 may also calculate the voltage $V_d$ by $V_d=I \times R_d$ by calculating the non-ohmic resistance $R_d$ using the relaxation parameter corresponding to the degraded state and the charging/discharging tendency of the storage battery. The corrector 6 can correct the voltage data by subtracting the voltage $V_d$ from the voltage V of the voltage data. The relaxation parameter used as the correction parameter is stored in advance, with the degraded state and the charging/discharging tendency associated therewith, in the degradation characteristic DB 10 which will be described later.

Next, the relaxation parameter will be described. The relaxation parameter is a set of one or more parameters included in a relaxation expression which is provided as a polynomial. The relaxation expression is obtained by regression analysis of the relaxation behavior as an approximate expression of the non-ohmic resistance $R_d$. The regression analysis may be single regression analysis or multiple regression analysis. The relaxation expression may be a linear expression or a high power expression of an explanatory variable.

For example, $R_d = A \times \Delta Q_2 + B$ may be used as the relaxation expression. In this case, the relaxation parameter may be expressed as (A, B) which is a set of parameters A, B. The variation $\Delta Q_2$ represents the variation of the charged amount of the storage battery in the period $t_2$. A calculation method of the non-ohmic resistance $R_d$ will be described below.

The corrector 6 first obtains the cycle λ from the tendency determiner 5 and then obtains the set value j (>0) from the set value DB 4 at time $t_2$ to calculate the time equivalent to 1/j of the cycle. That is, $t_2=\lambda/j$, where j is a set value for calculating the period $t_2$. Preferably, j may be equal to or more than 1. This is because the non-ohmic resistance $R_d$ can be approximated more precisely when the variation $\Delta Q_2$, which is a variation during a period $t_2$ shorter than the cycle λ, is used.

Next, the corrector 6 calculates the variation $Q_2$ of the charged amount of the storage battery during the period $t_2$. As illustrated in FIG. 3, when the charged amount data is included in the measurement data, the corrector 6 can calculate the variation $\Delta Q_2$ by subtracting the former charged amount at the time preceding the present time by $t_2$ from the present charged amount. When the charged amount is not included in the measurement data, the corrector 6 may calculate the variation $\Delta Q_2$ by generating the charged amount data from the current or voltage data. Further, the corrector 6 may also calculate the variation $\Delta Q_2$ by determining an accumulated value of the current data between the present time and the time preceding the present time by $t_2$. The corrector 6 may also calculate the variation $\Delta Q_2$ by obtaining the charged amount data generated by the tendency determiner 5.

Figure 9:
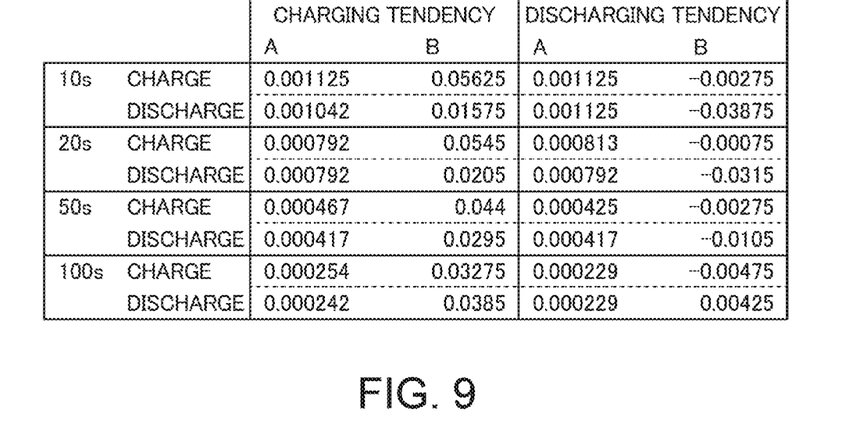
FIG. 9 illustrates an example of a table of relaxation parameters.

The corrector 6 obtains the relaxation parameter according to the table of relaxation parameters illustrated in FIG. 9, based on the value $t_2$, the tendency of the charging/discharging obtained in the tendency determiner 5, and the present charging/discharging state. The relaxation parameter is a coefficient of the relaxation expression which is the polynomial as mentioned above. For example, a linear expression of $A \times \Delta Q_2 + B$ may be used as the relaxation expression, or a quadratic expression of $A \times \Delta Q_2^2 + B \times \Delta Q_2 + C$ may be used as the relaxation expression. When the quadratic expression is used, variables (A, B) and (A, B, C) are listed in the table as the relaxation expressions, respectively. If a cubic or higher power expression is used as the relaxation expression, at least three variables are listed in the table. In FIG. 9, a linear expression is used as the relaxation expression.

The corrector 6 puts the calculated variation $Q_2$ and the relaxation parameter (A, B) in the relaxation expression to calculate the non-ohmic resistance $R_d$.

The period $t_2$ or the cycle λ may be determined in advance. In this case, the period $t_2$ and the cycle λ are stored in the set value DB 4.

During the initial correction when the evaluation of the degraded state has not been performed yet, the corrector 6 corrects the voltage data using the initial set value of the correction parameter. The initial set value of the correction parameter is, as mentioned above, stored in the set value DB 4. After the evaluation of the degraded state has been performed, the corrector 6 corrects the voltage data using the correction parameter having been fed back from the feedbacker 12.

The QV curve generator 7 generates the QV curve based on the voltage data corrected by the corrector 6. The QV curve is a charging/discharging curve of the storage battery, representing the relationship between the charging/discharging amount Q and the voltage V of the storage battery. The charging/discharging curve includes a charging curve and a discharging curve. The charging curve represents the relationship between the charged amount of the storage battery and the voltage V, and the discharging curve represents the relationship between the discharging amount Q of the storage battery and the voltage V.

The QV curve generator 7 may use the current data or the charged amount data to generate the QV curve. The QV curve generator 7 may also smooth the QV curve using the polynomial regression or the moving average. Accordingly, the noise in the corrected voltage data can be removed.

Figure 5:
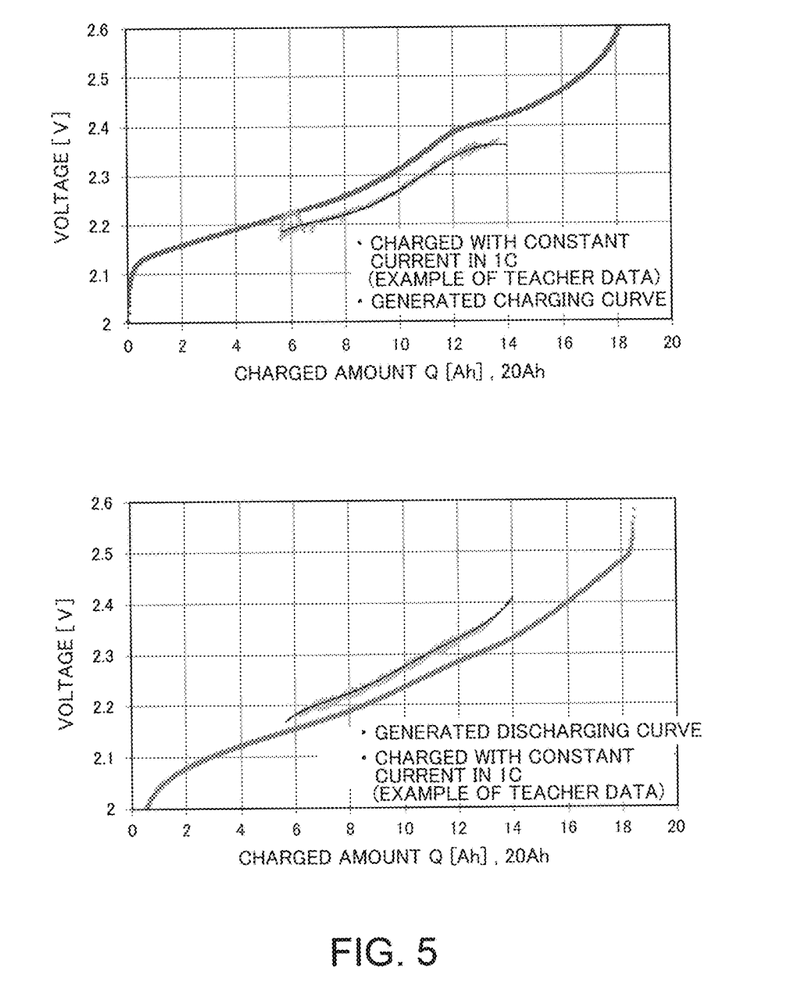
FIG. 5 illustrates examples of QV curves of the constant voltage and QV curves generated by corrected voltages.

FIG. 5 illustrates an example of the charging and discharging curves generated by the QV curve generator 7. In the charging curve of FIG. 5, the charging curve (teacher data) generated by charging the storage battery with a constant current is indicated by a bold line, and the charging curve generated by the QV curve generator 7 is indicated by a thin line. In the discharging curve of FIG. 5, the discharging curve (teacher data) generated by charging the storage battery with a constant current is indicated by a bold line, and the discharging curve generated by the QV curve generator 7 is indicated by a thin line. In FIG. 5, the QV curve generated by the QV curve generator 7 is smoothed by the regression processing using a sextic function.

The dQdV curve generator 8 generates the dQdV curve from the QV curve generated by the QV curve generator 7. The dQdV curve represents the relationship between the voltage V and dQ/dV which is obtained by differentiating the charging/discharging amount Q with the voltage V. The dQdV curve generator 8 can generate the dQdV curve by, for example, differentiating the QV curve generated by the QV curve generator 7 with the voltage V.

Figure 6:
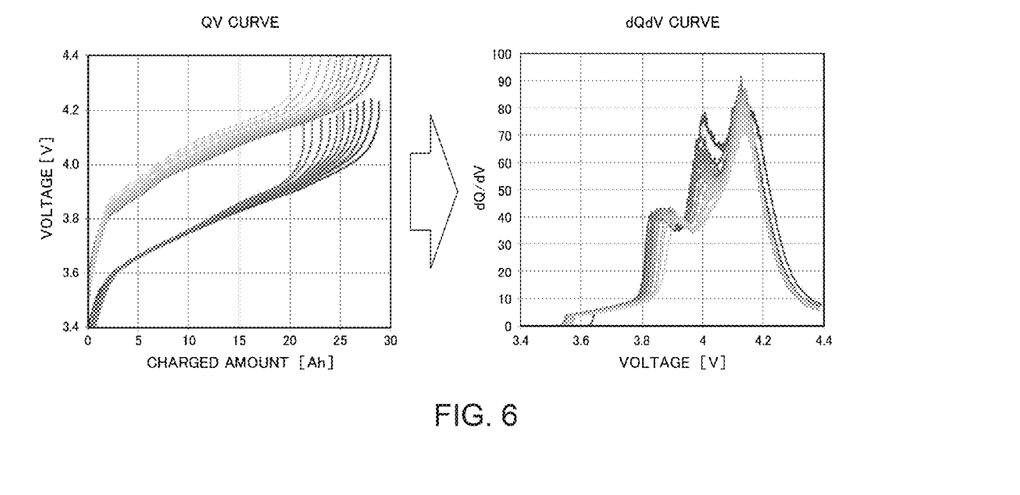
FIG. 6 is an explanatory view of a relationship between the QV curve and a dQdV curve.

The degraded state evaluator 9 (hereinafter referred to as the "evaluator 9") calculates the characteristic quantity, such as the QV characteristic quantity and the dQdV characteristic quantity, from the QV curve and the dQdV curve, respectively, of the storage battery. FIG. 6 illustrates an example of the QV curve and the dQdV curve. In FIG. 6, the QV curves for each degraded state of the storage battery and the dQdV curves generated from the individual QV curve are illustrated. As illustrated in FIG. 6, the shape of the QV curve and the dQdV curve may change according to the degraded state of the storage battery. Accordingly, the characteristic quantity correlated with the degraded state of the storage battery can be calculated from the QV and dQdV curves.

Figure 7:
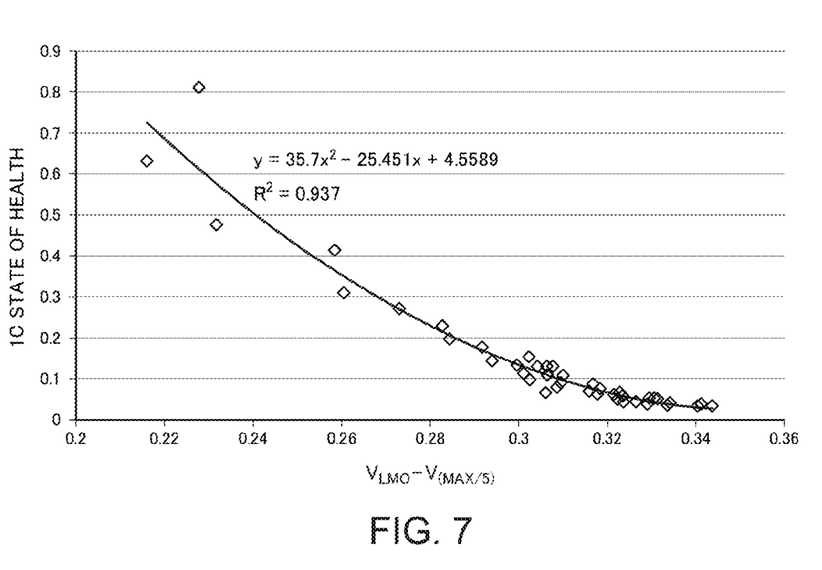
FIG. 7 illustrates an example of a relationship between the dQdV characteristic quantity and a degraded state.

FIG. 7 illustrates an example of a relationship between the degraded state and the dQdV characteristic quantity calculated from the dQdV curve. In FIG. 7, the horizontal axis represents the dQdV characteristic quantity $V_{LMO}-V_{(MAX/5)}$, and the vertical axis represents a state of health (SoH) which indicates the degraded state of the storage battery. As illustrated in FIG. 7, the dQdV characteristic quantity $V_{LMO}-V_{(MAX/5)}$ is correlated with the SoH.

The evaluator 9 can calculate an arbitrary parameter that is correlated with the degraded state as the characteristic quantity. The characteristic quantity may include, but not limited to, peak and valley portions and infection points of the QV and dQdV curves, and infection points and the maximum and minimum values of the differential values. The evaluator 9 calculates these characteristic quantities according to the characteristic quantity calculating method stored in the SoC range DB 2. The evaluator 9 may calculate one characteristic quantity or more than one characteristic quantities.

The evaluator 9 evaluates the degraded state of the storage battery based on the calculated characteristic quantity. The evaluator 9 evaluates the degraded state by comparing the characteristic quantity with the relationship between the characteristic quantity and the degraded state obtained by referring to the degradation characteristic DB 10 as illustrated in FIG. 7.

The evaluator 9 may evaluate, in addition to the characteristic quantity, the degraded state based on the QV curve and the dQdV curve. In this case, the evaluator 9 evaluates the degraded state by comparing the QV and dQdV curves with the teacher curves stored in the degradation characteristic DB 10 which will be described later.

The degradation characteristic DB 10 stores the degradation characteristic of the storage battery. The degradation characteristic may include, but not limited to, for example, battery performance, the QV curve, the dQdV curve, the characteristic quantity, and the correction parameter for each degraded state of the storage battery.

The degradation characteristic stored in the degradation characteristic DB 10 is obtained from a degradation test performed in advance under controlled environments for the storage battery of the type identical to that of the storage battery to be evaluated. In the degradation test, variables such as an environmental temperature, the SoC, and the constant current rate, with which the battery performance and the characteristic quantity are recognized to have a correlation are used.

Figure 8:
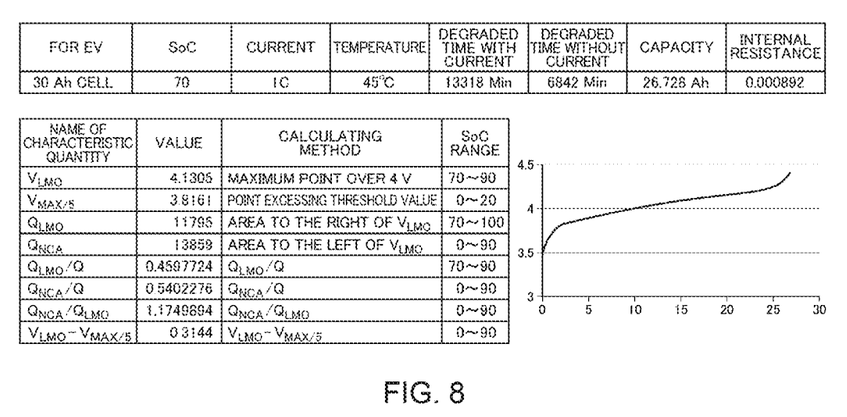
FIG. 8 illustrates an example of a degradation characteristic stored in a degradation characteristic database (DB).

FIG. 8 illustrates an example of the degradation characteristic stored in the degradation characteristic DB 10. The degradation characteristic illustrated in FIG. 8 has been obtained from the degradation test performed under the condition of 70% SoC, the constant current rate of 1 C, and the environmental temperature of 45° C. for a 30 Ah cell for electric vehicles (EV).

In FIG. 8, degradation time with or without the electric current, a capacity, the internal resistance, and the QV curve are stored as the degradation characteristics. The degradation time with or without the electric current represents the remaining life of the storage battery. The capacity represents the degraded state of the storage battery (capacity=an initial battery capacity×SoH). The internal resistance is the ohmic resistance $R_{CT}$. In FIG. 8, the types, values, calculating methods, and the SoC ranges of the characteristic quantities are stored as the degradation characteristics. The values of the characteristic quantities are calculated based on the QV curve of FIG. 8.

The degradation characteristic DB 10 stores a plurality of degradation characteristics as illustrated in FIG. 8 for each degradation state. The evaluator 9 can evaluate the degraded state of the storage battery using, as the teacher data, the QV and dQdV curves stored in the degradation characteristic DB 10. The evaluator 9 can also evaluate the degraded state of the storage battery by obtaining the relationship between the characteristic quantities and the degraded state from the characteristic quantities stored in the degradation characteristic DB 10. The corrector 6 can also correct the voltage data using the correction parameter stored in the degradation characteristic DB 10.

The SoC range DB 2 described above can be generated by extracting the type, the calculating method, and the Soc range of the characteristic quantity from the degradation characteristic DB 10. The initial set value of the correction parameter stored in the set value DB 4 can be selected from the correction parameter values stored in the degradation characteristic DB 10.

The degradation characteristics stored in the degradation characteristic DB 10 may include the time constant or the relaxation parameter of the voltage response as the correction parameter. FIG. 9 illustrates an example of the relaxation parameter stored in the degradation characteristic DB 10. In FIG. 9, the relaxation parameters (A, B) are sorted by the charging/discharging tendency, the current charging/discharging state, and the period $t_2$, and stored in the form of a table. This is because the relaxation parameter not only depends on the degraded state of the storage battery, but also depends on the charging/discharging tendency, the current charging/discharging state, and the charging/discharging cycle λ of the storage battery.

When the table of the relaxation parameter corresponding to the degraded state of the storage battery is obtained, the corrector 6 selects the relaxation parameter from the obtained table according to the charging/discharging tendency or the like to correct the voltage data.

The remaining life estimator 11 estimates the remaining life of the storage battery based on the degraded state evaluated by the evaluator 9. The remaining life estimator 11 obtains, as an estimation value of the remaining life of the storage battery, the remaining life in the degradation characteristic of the degraded state evaluated by the evaluator 9 by referring to, for example, the degradation characteristic DB 10. Alternatively, the remaining life estimator 11 may estimate the remaining life of the storage battery by referring to the degradation characteristic DB 10 to calculate the relationship between the degraded state and the remaining life, and extrapolate or interpolate the degraded state evaluated by the evaluator 9. Further, the remaining life estimator 11 may estimate the remaining life of the storage battery based on the characteristic quantity, instead of the degraded state, calculated by the evaluator 9.

The feedbacker 12 feeds back, to the corrector 6, the correction parameter corresponding to the degraded state evaluated by the evaluator 9. The feedbacker 12 may, for example, refer to the degradation characteristic DB 10 to feed back, as the correction parameter, the correction parameter of the degradation characteristic in the degraded state evaluated by the evaluator 9. The feedbacker 12 may also refer to the degradation characteristic DB 10 to calculate the relationship between the degraded state and the correction parameter, and then feed back the correction parameter calculated by extrapolation or interpolation of the degraded state evaluated by the evaluator 9.

The corrector 6 corrects the voltage data based on the correction parameter fed back from the feed backer 12. That is, the correction parameter used by that the corrector 6 for correction of the voltage data is updated each time the evaluator 9 evaluates the degraded state. By updating the correction parameter in this manner, the voltage data of the storage battery can be corrected precisely in real time.

Figure 10:
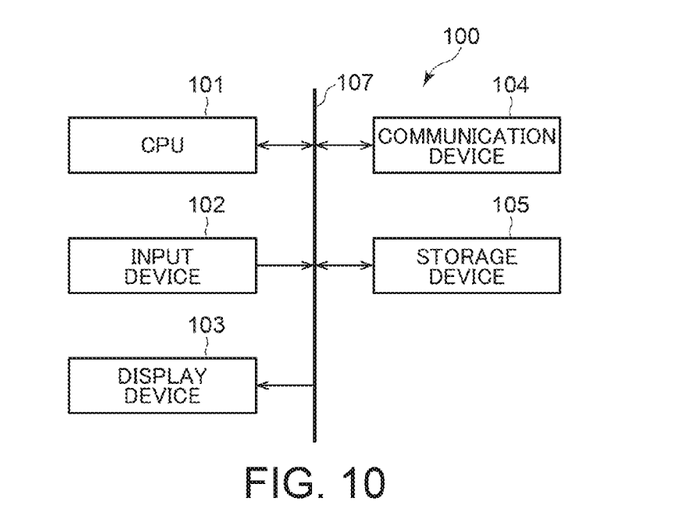
FIG. 10 is a block diagram illustrating a hardware structure of a storage battery evaluating apparatus of FIG. 1.

Next, the hardware structure of the evaluating apparatus according to the present embodiment will be described by referring to FIG. 10. The evaluating apparatus according to the present embodiment is constituted by a computer 100, as illustrated in FIG. 10. The computer 100 includes a central processing unit (CPU) 101, an input device 102, a display device 103, a communication device 104, and a storage device 105, with these devices being connected to each other via a bus 107.

The CPU 101 functions as a control device and an operating device of the computer 100. The CPU 101 executes an operating system (OS) or a storage battery evaluation program (hereinafter referred to as an "evaluation program") of the computer 100 to control individual devices included in the computer 100. The evaluation program is a program to allow the computer 100 to implement the functional structure described above of the evaluating apparatus. The computer 100 acts as the evaluating apparatus as the CPU 101 executes the evaluation program.

The input device 102 is used to input information to the computer 100. The input device 102 is implemented by, but now limited to, a keyboard, a mouse, a touch pane, etc. The user can use the input device 102 to input data stored in the measurement DB 1, the SoC range DB 2, the set value DB 4, and the degradation characteristic DB 10.

The display device 103 displays images and videos. The display device 103 may be implemented by, but not limited to, a liquid display (LCD), a cathode-ray tube (CRT), or a plasma display (PDP). Information such as the measurement data, the corrected voltage date, the QV curve, the dQdV curve, the correction parameter, the characteristic quantity, the remaining life, and the degraded state may be displayed on the display device 103.

The communication device 104 allows the computer 100 to communicate with an external device in a wired or wireless manner. The communication device 104 is implemented by, but not limited to, a modem, a hub, or a router, for example. The information stored in the measurement DB 1, the SoC range DB 2, the set value DB 4, and the degradation characteristic DB 10 may be input from the external device via the communication device 104.

The storage device 105 is a storage medium configured to store, for example, the OS of the computer 100, the evaluation program and data necessary for executing the evaluation program, and data generated by the execution. The storage device 105 includes a main storage device and an external storage device. The main storage device may be implemented by but not limited to, a random access memory (RAM), a dynamic random access memory (DRAM), and a static random access memory (SRAM). The external storage device may be implemented by, but not limited to, a hard disc, an optical disc, a flash memory, and a magnetic tape. The measurement DB 1, the SoC range DB 2, the set value DB 4, and the degradation characteristic DB 10 are constituted by the storage device 105.

The computer 100 may include one or more CPUs 101, the input devices 102, the display devices 103, the communication devices 104, and the storage devices 105. Also, a peripheral device, such as a printer or a scanner, may be connected to the computer 100.

The evaluating apparatus may be implemented by a single computer 100, or a system including a plurality of computers 100 connected with each other may be provided.

Further, the evaluation program may be previously stored in the storage device 105 of the computer 100, stored in a storage medium such as a CD-ROM, or uploaded on the Internet. In any case, the evaluation device can be implemented by installing and executing the evaluation program in the computer 100.

Figure 11:
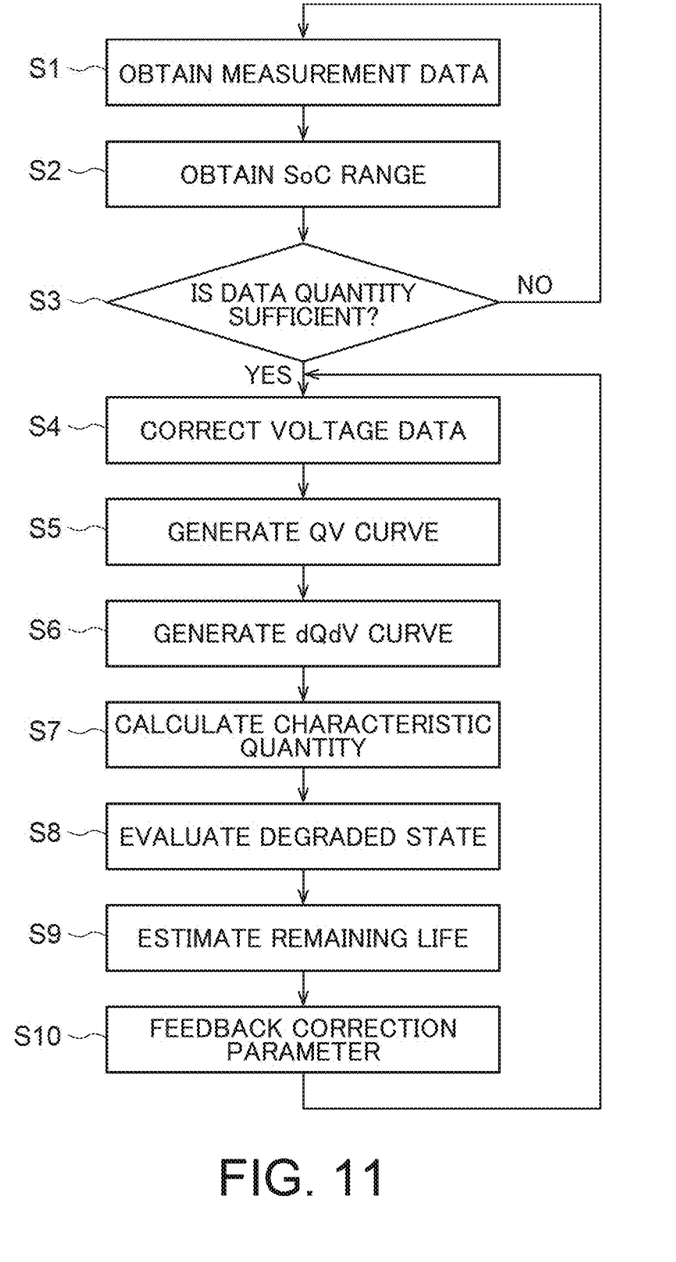
FIG. 11 is a flowchart illustrating an operation of the storage battery evaluating apparatus of FIG. 1.
Figure 12:
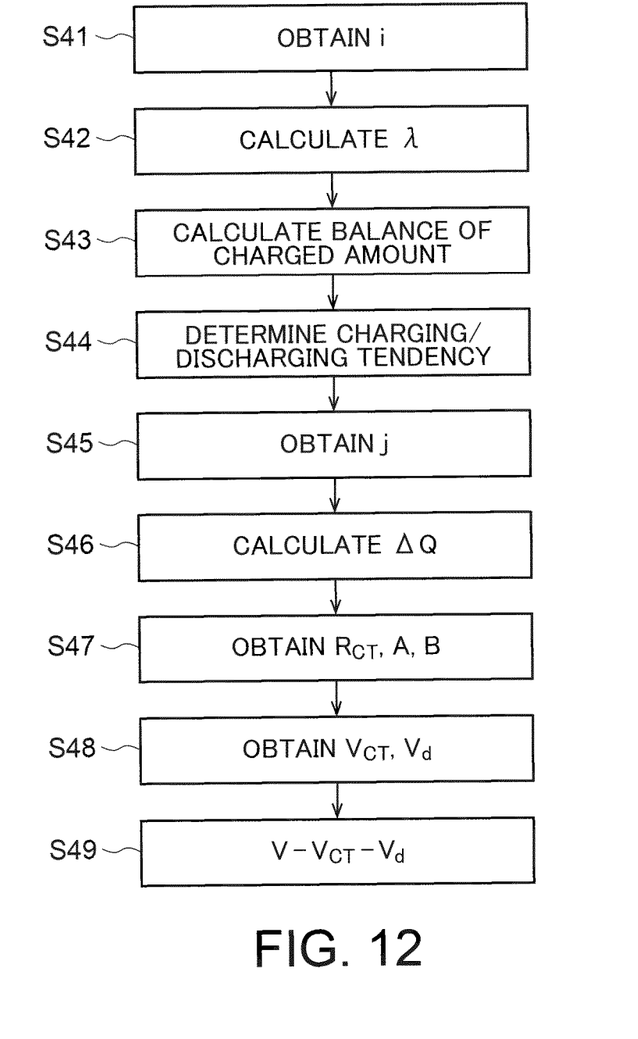
FIG. 12 is a flowchart illustrating a voltage data correcting method.

Next, an operation of the evaluating apparatus according to the present embodiment will be described by referring to FIGS. 11 to 13. FIG. 11 is a flowchart illustrating an operation of the evaluation device according to the present embodiment.

In step S1, the data quantity determiner 3 obtains measurement data from the measurement DB 1. The data quantity determiner 3 may obtain all measurement data stored in the measurement DB 1 or the measurement data of a partial period. The period when the data quantity determiner 3 obtains the measurement data can be set arbitrarily.

In step S2, the data quantity determiner 3 obtains the SoC range from the SoC range DB 2 for each characteristic quantity. The data quantity determiner 3 may obtain one or more SoC ranges.

In step S3, the data quantity determiner 3 determines whether a sufficient data quantity has been obtained as the measurement data from the measurement DB 1 for each SoC range obtained from the SoC range DB 2. The determination method has been described above. If the data quantity is insufficient (NO at step S3), the process returns to step S1. If a sufficient quantity of data is provided (YES at step S3), the process proceeds to step S4.

In step S4, the corrector 6 corrects the voltage data. Details of the voltage-data correction processing will be described later.

In step S5, the QV curve generator 7 obtains the voltage data from the corrector 6 and generates the QV curve. At this time, the QV curve generator 7 may perform smoothing processing of the QV curve, if needed.

In step S6, the dQdV curve generator 8 obtains the QV curve from the QV curve generator 7 to generate the dQdV curve.

In step S7, the evaluator 9 obtains the dQdV curve from the dQdV curve generator 8, obtains the calculating method of the characteristic quantity from the SoC range DB 2, and calculates the characteristic quantity based on the obtained dQdV curve. The evaluator 9 may also calculate the characteristic quantity based on the QV curve by obtaining the QV curve from the QV curve generator 7.

In step S8, the evaluator 9 evaluates the degraded state of the storage battery based on the calculated characteristic quantity. The evaluator 9 may evaluate the degraded state using the QV and dQdV curves in addition to the characteristic quantity.

In step S9, the remaining life estimator 11 obtains the degraded state of the storage battery from the evaluator 9 and estimates the remaining life of the storage battery by referring to the degradation characteristic DB 10.

In step S10, the feedbacker 12 obtains the degraded state of the storage battery from the evaluator 9, obtains the correction parameter corresponding to the degraded state by referring to the degradation characteristic DB 10, and feeds back the correction parameter to the corrector 6.

Next, processing of correcting the voltage data (step S4) will be described in detail by referring to FIG. 12. A flowchart FIG. 12 illustrates the processing of correcting the voltage data. In the description below, it is assumed that the correction parameters are the ohmic resistance $R_{CT}$ and the relaxation parameters (A, B).

In step S3 of FIG. 11, if it is determined that the data quantity is sufficient (YES at step S3), the process proceeds to step S41.

In step S41, the tendency determiner 5 obtains the set value i of the set value DB 4.

In step S42, the tendency determiner 5 obtains the measurement data from the data quantity determiner 3 and calculates the charging/discharging cycle λ of the storage battery.

In step S43, the tendency determiner 5 calculates a period $t_1$ (=λ×i) to calculate the variation $\Delta Q_1$ of the charged amount between the present time and the time preceding the present time by the period $t_1$.

In step S44, the tendency determiner 5 determines the charging/discharging tendency of the storage battery based on the variation $\Delta Q_1$.

In step S45, the corrector 6 obtains the set value j from the set value DB 4.

In step S46, the corrector 6 obtains the cycle λ, the charging/discharging tendency, and the measurement data from the tendency determiner 5, and calculate the period $t_2$ (=λ/j) to calculate the variation £$Q_2$ of the charged amount between the present and the time preceding the present by the period $t_2$.

In step S47, the corrector 6 obtains the ohmic resistance $R_{CT}$ and the table of the relaxation parameters (A, B). During the initial correction when the evaluator 9 has not been performed yet, the corrector 6 obtains the ohmic resistance $R_{CT}$ and the initial set values of the table of the relaxation parameters (A, B) from the set value DB.

Meanwhile, after the evaluation of the degraded state has been performed by the evaluator 9, the corrector 6 obtains the ohmic resistance $R_{CT}$ and the table of relaxation parameters (A, B) that have been fed back from the feedbacker 12. The corrector 6 can therefore obtain the ohmic resistance $R_{CT}$ and the table of the relaxation parameter (A, B) corresponding to the degraded state of the storage battery.

The corrector 6 then obtains the relaxation parameter (A, B) from the table of the relaxation parameters (A, B) corresponding to the charging/discharging tendency, the current charging/discharging state, and the period $t_2$. For example, the table of relaxation parameters of FIG. 9 is obtained by the corrector 6. If the storage battery is in the charging tendency and is being charged, and the period $t_2$ is 10 seconds, the corrector 6 obtains the relaxation parameters (0.001125, 0.05625) from the table of FIG. 9. As a result, the corrector 6 can obtain the relaxation parameter (A, B) corresponding to the degraded state, the charging/discharging tendency, and the current charging/discharging state of the storage battery and the period $t_2$.

If the calculated period $t_2$ is not equal to the period $t_2$ of the table, the corrector 6 should select relaxation parameters (A, B) sorted in the period $t_2$ as the period closest to the calculated period $t_2$.

In step S48, the corrector 6 calculates the voltage $V_{CT}$ (=I×$R_{CT}$) from the ohmic resistance $R_{CT}$ and the current data. As a result, time series data of the voltage $V_{CT}$ is generated. The corrector 6 also calculates the non-ohmic resistance $R_d$ (=A×$\Delta Q_2$+B) from the relaxation parameters (A, B) and the variation $\Delta Q_2$, while calculating the voltage $V_d$(=I×$R_d$) from the non-ohmic resistance $R_d$ and the current data. As a result, time series data of the voltage $V_d$ is generated.

In step S49, the corrector 6 subtracts the voltage component $V_{CT}$, $V_d$ from the voltage V of the voltage data by (V−$V_{CT}$−$V_d$). Thus, the voltage component caused by the ohmic resistance $R_{CT}$ and the non-ohmic resistance $R_d$ is removed from the voltage data to correct the voltage data. After the voltage data has been corrected, the process proceeds to step S5.

Figure 13:
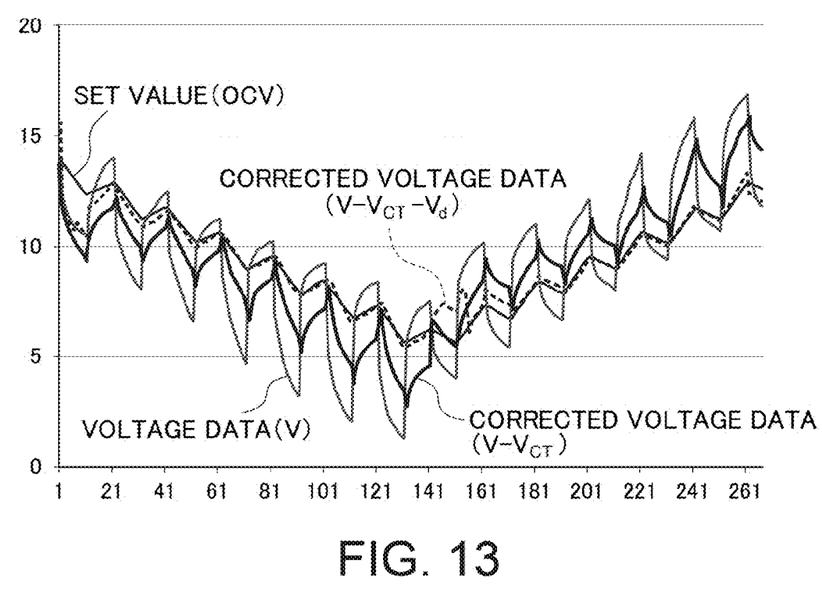
FIG. 13 illustrates an example of voltage data representing a correction effect.

FIG. 13 illustrates an example of corrected voltage data. In FIG. 13, the voltage data (V) included in the measurement data, the corrected voltage data (V−$V_{CT}$) with the voltage $V_{CT}$ being removed, the corrected voltage data (V−$V_{CT}$−$V_d$) with the voltage $V_{CT}$ and the voltage $V_d$ being removed, and the set value (OCV) are illustrated. The set value (OCV) is the data of the voltage $V^0$ included in the voltage data (V).

As illustrated in FIG. 13, the voltage data (V) of the storage battery that repeats charging and discharging can be brought closer to the set value (OCV). As can be seen from FIG. 13, the corrected voltage data (V−$V_{CT}$−$V_d$) is closer to the set value (OCV) than the corrected voltage data (V−$V_{CT}$).

As described above, the evaluating apparatus according to the present embodiment can evaluate the degraded state of the storage battery based on the measurement data of the storage battery that repeats charging and discharging. Therefore, the degraded state of the storage battery can be evaluated in real time without stopping the charging/discharging of the power storage system. The degraded state of the storage battery can also be evaluated without dumping the power charged in the storage battery or temporarily storing the power in another storage battery.

Since the voltage component caused by the internal resistance, such as the ohmic resistance $R_{CT}$ or the non-ohmic resistance $R_d$, can be removed from the voltage data, the voltage data can be corrected very precisely. By evaluation of the degraded state based on the corrected voltage data, the evaluation of the degraded state of the storage battery and the calculation of the SoC of the storage battery can be performed precisely.

Further, various types of storage batteries can be evaluated for the degraded state thereof simply by changing the degradation characteristic stored in the degradation characteristic DB 10.

In addition, the determination of the data quantity leads to the restriction of low precision evaluation of the degraded state based on insufficient measurement data.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A storage battery evaluating apparatus, comprising:
a determiner configured to determine a charging/discharging tendency of a storage battery based on measurement data including voltage data of the storage battery;
a corrector configured to correct the voltage data based on a correction parameter, the correction parameter corresponding to at least one of the charging/discharging tendency and a degraded state of the storage battery;
a QV curve generator configured to generate a QV curve of the storage battery based on the voltage data which has been corrected;
an evaluator configured to evaluate the degraded state based on the QV curve; and
a feedbacker configured to feed back, to the corrector, the correction parameter corresponding to the degraded state.

2. The apparatus according to claim 1, wherein the corrector calculates, based on the correction parameter, a voltage component caused by an internal resistance of the storage battery, and removes the voltage component from the voltage data.

3. The apparatus according to claim 1, wherein the corrector calculates, based on a relaxation parameter of the storage battery, the relaxation parameter corresponding to the charging/discharging tendency and the degraded state, a voltage component caused by a non-ohmic resistance of the storage battery.

4. The apparatus according to claim 1, wherein the corrector calculates, based on an ohmic resistance of the storage battery, the ohmic resistance corresponding to the degraded state, a voltage component caused by the ohmic resistance.

5. The apparatus according to claim 1, wherein the determiner determines the charging/discharging tendency based on a variation of a charged amount of the storage battery during a predetermined period.

6. The apparatus according to claim 1, further comprising:
a degradation characteristic database configured to store the correction parameter obtained by a degradation test.

7. The apparatus according to claim 1, further comprising:
a dQdV curve generator configured to generate a dQdV curve of the storage battery from the QV curve.

8. The apparatus according to claim 1, wherein the evaluator calculates, from at least one of the QV curve and a dQdV curve, a characteristic quantity correlated with the degraded state of the storage battery, and evaluates the degraded state based on the characteristic quantity.

9. The apparatus according to claim 1, further comprising:
an estimator configured to estimate a remaining life of the storage battery based on the degraded state.

10. A storage battery evaluating method performed by a computer system including a processor and a hardware storage, comprising:
determining by the processor a charging/discharging tendency of a storage battery based on measurement data including voltage data in the hardware storage;
correcting by the processor the voltage data based on a correction parameter corresponding to at least one of the charging/discharging tendency and a degraded state of the storage battery;
generating by the processor a QV curve of the storage battery based on the voltage data which has been corrected; and
evaluating by the processor the degraded state based on the QV curve;
wherein the correcting the voltage data includes correcting the voltage data based on the correction parameter corresponding to the degraded state.

* * * * *